United States Patent [19]

Coules

[11] 4,297,769
[45] Nov. 3, 1981

[54] LOCKING STAND OFF

[75] Inventor: Ronald A. Coules, Barrington, Ill.

[73] Assignee: Unarco Industries, Inc., Chicago, Ill.

[21] Appl. No.: 107,498

[22] Filed: Dec. 26, 1979

[51] Int. Cl.³ .................. A44R 21/00; F16B 19/00
[52] U.S. Cl. .................................................. 174/138 D
[58] Field of Search ............. 24/73 P, 73 PF, 73 PM, 24/73 HS; 174/138 D; 85/5 R; 248/71

[56] References Cited

U.S. PATENT DOCUMENTS

| | | | |
|---|---|---|---|
| 2,758,498 | 8/1956 | Johnson | 85/5 R |
| 3,332,463 | 7/1967 | Seckerson et al. | 24/73 P |
| 3,393,350 | 7/1968 | Goudy et al. | 24/73 P |
| 3,688,635 | 9/1972 | Fegen | 24/73 PF |
| 3,704,486 | 12/1972 | Blacklock | 174/138 D |
| 3,777,052 | 12/1973 | Fegen | 24/73 P |
| 3,811,154 | 5/1974 | Lindeman et al. | 24/73 P |
| 3,909,883 | 10/1975 | Fegen | 24/73 P |
| 4,112,815 | 9/1978 | Tanaka | 24/73 P |
| 4,143,577 | 3/1979 | Eberhardt | 24/73 P |
| 4,200,900 | 4/1980 | McGeorge | 174/138 D |

FOREIGN PATENT DOCUMENTS 1006613  3/1977  Canada ........................ 174/138 D Primary Examiner—Victor N. Sakran
Attorney, Agent, or Firm—Dressler, Goldsmith, Shore, Sutker & Milnamow, Ltd.

[57] ABSTRACT

A one-piece fastener has an upper end that is detachably secured to a first panel and a lower end that is secured to a second panel.

The lower end includes a flange that is receivable in an aperture in the second panel and bears against the wall of the aperture to minimize rocking movement of the fastener relative to the second panel. A lower portion of the flange is tapered to facilitate alignment of the flange within the aperture in the second panel.

6 Claims, 5 Drawing Figures

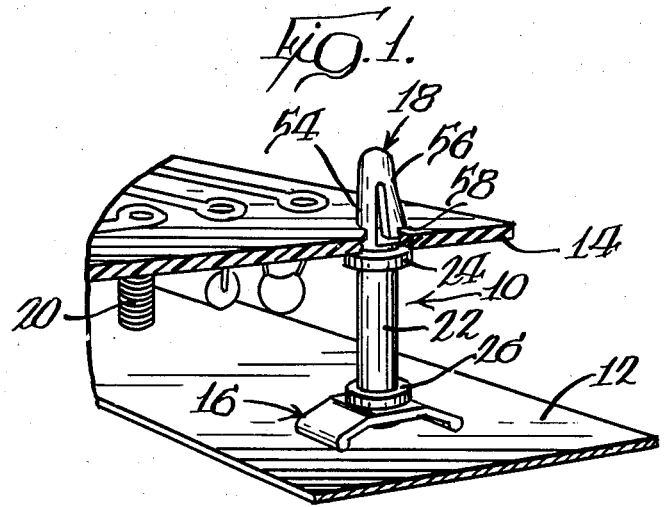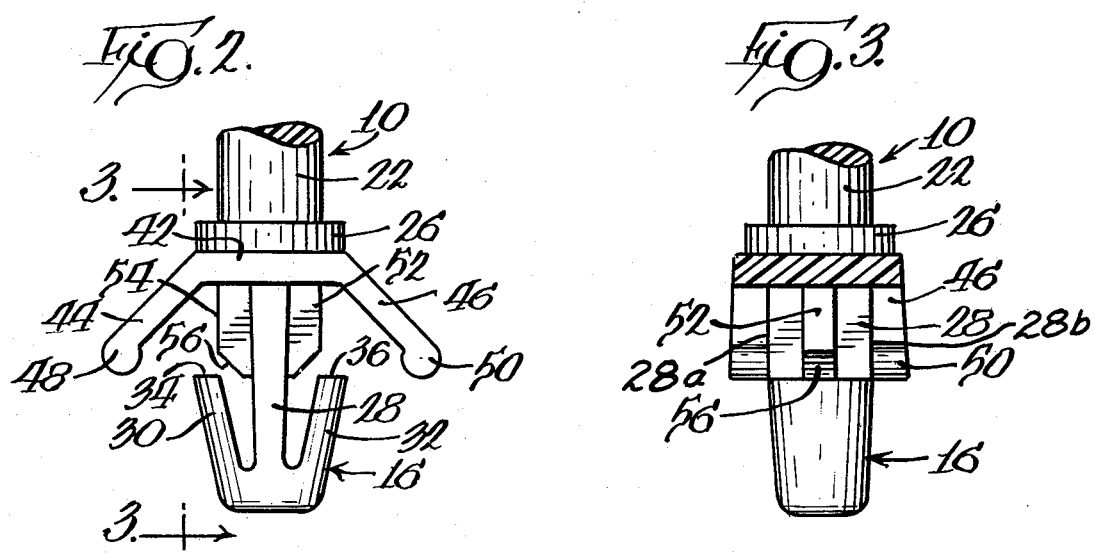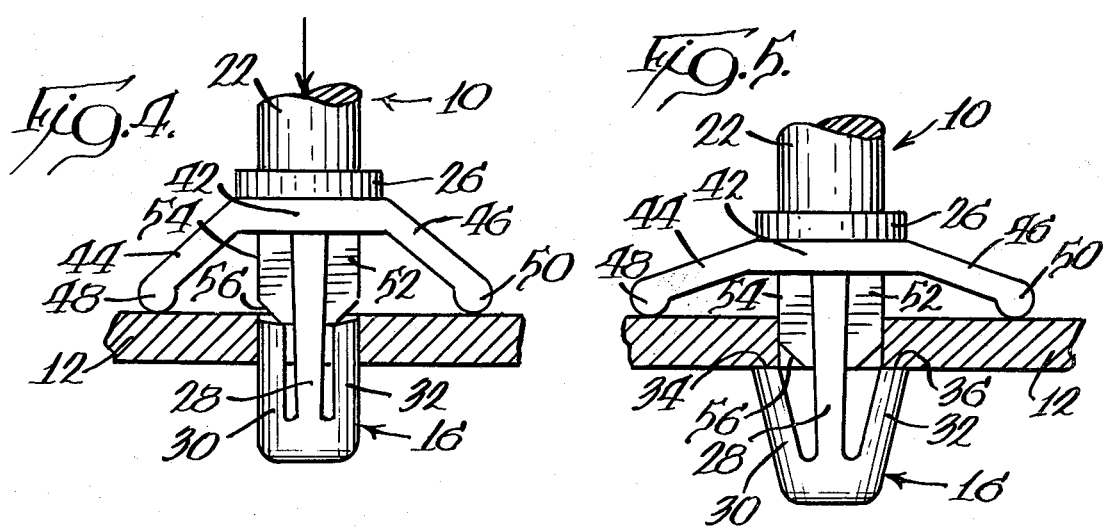

LOCKING STAND OFF

DESCRIPTION

1. Technical Field of the Invention

The present invention relates to one-piece fasteners for maintaining a pair of apertured panels in spaced-apart relation.

2. Background of the Invention

The present invention relates to a fastener or support member for mounting a pair of panels, such as electronic components, in spaced-apart relation. The panels may comprise a printed circuit board that is removably secured to the fastener and maintained by the fastener in spaced-apart relation from a chassis.

Fasteners of this type are disclosed in Fegen U.S. Pat. Nos. 3,688,635, 3,777,052 and 3,909,883. The Fegen patents disclose a support with positive locking and unlocking means for detachably securing the support on the chassis and for mounting the circuit board on the support. A lower flexible means projects into a hole in the chassis. However, the lower flexible means does not strongly bear against the wall of the aperture in the chassis and therefore does not provide much resistance against pivoting or rocking movement of the support.

In an attempt to overcome this problem, U.S. Pat. No. 3,393,350 discloses that the arms or extensions that engage the upper surface of a panel have considerable width to act against rocking of the fastener. However, the arms or extensions are flexible and do not provide positive engagement against the wall of the aperture in the panel to minimize rocking.

SUMMARY OF THE INVENTION

The foregoing disadvantages of the prior art are overcome by the one-piece fastener of the present invention which detachably secures one panel in spaced-apart relation to a second panel, while minimizing pivotal or rocking movement of the fastener in relation to the panels.

The fastener includes an upstanding post that has a top end and a bottom end. Means extends upwardly from the top end of the post and is receivable in an aperture in the upper panel for securing the fastener to the upper panel.

A stem extends downwardly from the bottom end of the post and is adapted to be projected through an aperture in the lower panel. Means projects outwardly from the stem and is adapted to engage the bottom surface of the lower panel to prevent removal of the fastener from the lower panel.

Resiliently yieldable arm means is integral with at least one of the post and the stem, and merges therewith at a location spaced above the projecting means by a predetermined distance greater than the thickness of the lower panel. The resiliently yieldable arm means is adapted to bear against the upper surface of the lower panel.

Flange means extends downwardly from the arm means and has a cross-sectional dimension, in a plane parallel to a plane through the lower panel, that is no greater than the diameter of the aperture in the lower panel.

In accordance with the foregoing arrangement, the flange means is receivable in the aperture in the lower panel and is adapted to be disposed closely adjacent to the wall of the lower panel that defines the aperture thereby to minimize rocking movement of the fastener when positioned in the aperture in the lower panel.

In accordance with a further feature of the present invention, the flange means includes a lower portion that is tapered and comprises guide means to facilitate the alignment of the flange means within the aperture in the lower panel.

BRIEF DESCRIPTION OF THE DRAWING

FIG. 1 is a perspective view of the fastener of the present invention mounted on a chassis and supporting a circuit board, partially broken away to show interior detail;

FIG. 2 is a side elevational view of the lower end of the fastener of the present invention;

FIG. 3 is a sectional view taken along plane 3—3 in FIG. 2;

FIG. 4 is a side elevational view of the lower end of the fastener partially inserted into an aperture in the chassis; and FIG. 5 is a side elevational view of the lower end of the fastener fully received in the aperture in the chassis.

DETAILED DESCRIPTION OF THE PREFERRED EMBODIMENT

While this invention is susceptible of embodiment in many different forms, there is shown in the drawing and will herein be described in detail one embodiment of the invention, with the understanding that the present disclosure is to be considered as an exemplification of the principles of this invention and is not intended to limit the invention to the embodiment illustrated. The scope of the invention will be pointed out in the appended claims.

Referring to the drawing, FIG. 1 illustrates a one-piece mounting clip or fastener 10, also known as a locking stand off, in accordance with the present invention, which is used to maintain a pair of apertured panels 12 and 14 in spaced-apart relation. The fastener is adapted for supporting and mounting components in electrical and electronic equipment. Thus, the fastener has at its lower end a flexible locking member 16 for securement to the lower panel 12 which may comprise a chassis. The fastener has at its upper end 18 a resilient coupling for removably securing and supporting the upper panel 14 which may comprise a circuit board having electrical components 20 suspended therefrom in elevated position above and spaced-apart from the chassis.

As shown in FIG. 1, the fastener includes an upstanding, elongated, cylindrical post 22 having a top end and a bottom end. An upper shoulder or flange 24 is positioned at the top end of the post, and a lower shoulder or flange 26 is positioned at the bottom end of the post. Flanges 24 and 26 may be cylindrical in shape and equal in diameter.

A stem 28 extends downwardly from the bottom end of the post 22 and is adapted to be projected through an aperture in the panel 12, as shown in FIGS. 4 and 5. The stem 28 is generally flat and has a width no greater than the diameter of the aperture in panel 12. As can be best seen in FIG. 3, the upper end of stem 28 includes a pair of diametrically opposed generally flat wall means 28a and 28b, having vertically disposed free edge portions that are parallel with one another and with the axis of stem 28. Preferably, the width of the bottom end of the stem is slightly smaller than the width of the upper end of the stem (FIG. 3) to facilitate in inserting the stem into the aperture in the panel 12.

As best shown in FIG. 5, projecting means extends outwardly from the stem 28 and is adapted to engage the bottom surface of the panel 12 to prevent removal of the fastener from the panel 12. The projecting means preferably comprises a pair of flexible return portions 30 and 32 that extend upwardly and outwardly from the bottom of the stem 28. The return portions 30 and 32 each have a bottom end that is joined to the bottom of the stem 28, and a top free end that is spaced-apart from the stem 28 and terminates in upper surfaces 34 and 36, respectively. The upper surfaces 34 and 36 of the flexible return portions 30 and 32 are adapted to engage the bottom surface of the panel 12 adjacent to the aperture in the panel.

The flexible return portions 30 and 32 each have an outside surface. The distance between the outside surface of the bottom ends of the flexible return portions 30 and 32 is no greater than the diameter of the aperture in the panel 12, and the distance between the outer surfaces of the top ends of the flexible return portions in a free condition is greater than the diameter of the aperture in the panel 12. Thus, when the lower end 16 of the fastener is inserted in the aperture in the panel 12, the free ends of the flexible return portions 30 and 32 will be flexed inwardly (FIG. 4) toward one another due to the taper of the flexible return portions, and will flex outwardly again (FIG. 5) as the flexible return portions 30 and 32 pass through the panel 12. The upper surfaces 34 and 36 of the flexible return portions thereby engage the bottom surface of the panel 12, to prevent removal of the fastener 10 from the panel 12.

The fastener 10 includes resiliently yieldable arm means 40 adapted to bear against the upper surface of the panel 12. The arm means 40 is integral with at least one of the post 22 or the stem 28, and merges therewith at a location spaced above the upper surfaces 34 and 36 of the flexible return portions by a predetermined distance greater than the distance of the panel 12.

As shown in FIG. 2, the arm means 40 includes a generally flat central portion 42 and a pair of opposing arms or wings 44 and 46 that flare outwardly and downwardly from opposite ends of the central portion 42. The wings 44 and 46 are generally flat, flexible, angular extensions of the central portion 42. The wings 44 and 46 terminate in enlarged cylindrical fingers 48 and 50, respectively, that have axes perpendicular to the axis of the sleeve. The fingers are adapted to engage the upper surface of the panel 12, as shown in FIGS. 1, 4 and 5. The distance between the bottom surface of the central portion 42 and the upper surfaces 34 and 36 of the flexible return portions is a predetermined distance at least as great as the thickness of the panel 12.

The upper surface of the central portion 42 of the arm means merges with the bottom of the lower flange 26 of the post, and the top of the stem 28 merges with the bottom surface of the central portion 42 and extends downwardly therefrom.

The securement of the lower end 16 of the fastener 10 to the panel 12 is illustrated in FIGS. 4 and 5. As the lower end 16 is inserted into an aperture in the panel 12, the free ends of the flexible return portions 30 and 32 flex inwardly, the fingers at the ends of the wings 44 and 46 begin to engage the upper surface of the panel 12 (FIG. 4), and the wings 44 and 46 will then flex upwardly. After the flexible return portions 30 and 32 pass through the aperture and no longer bear against the wall of the aperture in the panel 12, they flex outwardly in accordance with their natural bias to assume the position shown in FIG. 5 in which the upper surfaces 34 and 36 are positioned below the bottom surface of the panel. At the same time, the wings 44 and 46 flex downwardly again toward their original position in accordance with their natural bias while fingers 48 and 50 are firmly in engagement with the upper surface of the panel 12 to move the upper surfaces 34 and 36 of the return portions 30 and 32 upwardly into engagement with the bottom surface of the panel. The wings 44 and 46 are deformed from their original position and exert a downward force on the upper surface of the panel 12. The foregoing arrangement also enables the lower end 16 of the fastener of the present invention to accommodate panels 12 of varying thicknesses.

It is a feature of the present invention that the lower end 16 of the fastener includes flange means 52 that is receivable in the aperture in the panel 12 and is adapted to be positioned closely adjacent to the sides of the aperture to minimize pivoting and rocking movement of the fastener 10 when it is positioned in the aperture in the panel 12. The flange means 52, which is depicted in FIGS. 2–5, comprises a thin, generally flat web of material that extends vertically and is perpendicular to the stem 28. The flange extends downwardly from the central portion 42 of the arm means 40, and is generally perpendicular to the central portion. The flange 52 includes an upper portion having a generally vertical outer edge 54, and a lower portion having a tapered outer edge 56 having one end that intersects outer edge 54 and an opposite end that intersects the stem 28. The flange means 52 preferably extends outwardly from both of the opposing surfaces of the stem 28.

As best seen in FIG. 5, the width of the upper portion of the flange means 52, between the outer edges 54, is no greater than, and is approximately equal to, the diameter of the aperture in the panel 12 so that the outer edges 54 will be positioned in close proximity to the wall of the panel 12 that defines the aperture. The tapered lower portion of the flange means 52 has a progressively smaller cross-sectional dimension as the lower portion extends farther from the central portion 42 of the arm means, whereby the lower portion of the flange comprises guide means to facilitate the alignment of the flange for insertion within the aperture in the panel 12. Thus, as the fastener is moved downwardly from the position of FIG. 4, inclined surfaces 56 will cam against the upper portion of the panel aperture and center the fastener relative to the panel aperture, if the fastener was offset from the axis of the panel aperture during initial insertion. The wall means 28*a* and 28*b* of stem 28 and flange means 52 preferably have an equal width dimension, so the free edge portions of the wall means and flange means are adapted to engage the panel apertures at four equally spaced locations to stabilize the fastener within the panel aperture against movement in any direction.

Means is also provided at the upper end 18 of the fastener for securing the fastener to a second panel 14. As shown in FIG. 1, the upper end 18 of the fastener includes a pair of legs 54 and 56 that are shaped generally in the form of an inverted V. The legs are joined together at the top of the upper end 18, which is at the bight of the V. Leg 54 is relatively rigid and is integrally connected at its bottom end to the upper flange 24 of the post 22, while leg 56 is resiliently deformable to permit insertion of the upper end 18 into an aperture in the panel 14.

In the unrestrained position shown in FIG. 1, leg 56 is spaced-apart from leg 54 away from the area of joinder, and leg 56 has an outer wall that is tapered generally outwardly from the top of the leg 56 at the bight of the legs towards the bottom of the leg 56. Leg 56 includes a shoulder 58 adjacent the bottom end of the leg that has a generally flat, horizontal, top wall and a downwardly extending inside wall. The top wall of the shoulder is spaced-apart from the top surface of the upper flange 24.

The outer surfaces of legs 54 and 56 adjacent the bight are arcuately shaped to facilitate insertion of the legs 54 and 56 through a generally circular aperture in the panel 14. As the legs 54 and 56 are inserted into the aperture in the panel 14, leg 56 is resiliently deformed and is pushed inwardly towards leg 54 until the shoulder 58 is clear of the panel 14. Leg 56 then springs outwardly towards its undeformed position and the shoulder 58 locks against the marginal edge of the aperture in the panel 14, with the vertical wall of the shoulder 58 engaging and bearing against the wall of the aperture, and the flat, bottom surface of the shoulder 58 engaging the top surface of the panel 14. The top surface of the upper flange 24 engages the bottom surface of the panel 14.

The upper end 18 of the fastener is thereby releasably secured to the panel 14, and can be detached therefrom by pushing leg 56 inwardly to release the shoulder from engagement with the panel 14. The panel 14 can then be lifted and moved away from the fastener 10. Fasteners in accordance with the present invention are preferably formed from a suitable electrically insulating material, such as a suitable polycarbonate or nylon, and by an injection molding technique.

From the foregoing, it will be observed that numerous variations and modifications may be effected without departing from the true spirit and scope of the novel concept of the invention. It is to be understood that no limitation with respect to the specific structure illustrated herein is intended or should be inferred. It is, of course, intended to cover by the appended claims all such modifications as fall within the scope of the claims.

What is claimed is:

1. A fastener for maintaining a pair of apertured panels in spaced-apart relation, comprising:

an upstanding elongated post having a top end and a bottom end, means extending upwardly from the top end of said post that is receivable in an aperture in one of said panels for securing said fastener to said one panel, a stem having a generally vertical axis and extending downwardly from said bottom end of said post and adapted to be projected through an aperture in the other of said panels, said stem comprising a pair of diametrically opposed generally flat wall means extending radially outwardly from said axis and having a cross-sectional dimension, in a plane parallel to a plane through said other panel, that is no greater than the diameter of said aperture in said other panel, said flat wall means each terminating in a free edge parallel with the free edge of the other wall means and with the axis of said stem, means projecting outwardly from said stem and adapted to engage the bottom surface of said other panel to prevent removal of said fastener from said other panel, resiliently yieldable arm means adapted to bear against the upper surface of said other panel, said arm means being integral with at least one of said post and said stem, and merging therewith at a location spaced above said projecting means by a predetermined distance greater than the thickness of said other panel, and a pair of flat diametrically opposed generally planar flange means extending downwardly from said arm means and radially outwardly from said axis, and having a cross-sectional dimension, in a plane parallel to a plane through said other panel, that is no greater than the diameter of said aperture in said other panel, said flat flange means each terminating in a free edge parallel with the free edge of the other flange means and with the axis of said stem, whereby the free edges of said flat wall means and said flat flange means are adapted to be positioned closely adjacent to the wall of said other panel that defines said aperture and are together adapted to engage the wall of said other panel at four spaced apart locations that are about equally spaced from one another and are positioned radially outwardly from said axis, thereby to minimize rocking movement of said fastener when positioned in said aperture in said other panel.

2. A fastener as defined in claim 1 wherein said stem is generally flat and said flange means comprises a generally flat web that is perpendicular to said stem, said flange means having an upper portion and said lower portion, said upper portion having a width no greater than, and approximately equal to, the diameter of said aperture in said other panel.

3. A fastener as defined in claim 1 wherein said projecting means comprises at least one flexible return portion on said stem having a free end spaced-apart from said stem, said free end adapted to engage the bottom surface of said other panel adjacent to said aperture in said second panel.

4. A fastener as defined in claim 3 wherein two flexible return portions are provided on opposing sides of said stem and extend upwardly and outwardly from the bottom of said stem, said flexible return portions having an outside surface, a bottom end and a top end, the distance between the bottom ends of said flexible return portions along the outside surface thereof being no greater than the diameter of said aperture in said other panel, and the distance between the top ends of said flexible return portions along the outside surface thereof being greater than the diameter of said aperture in said other panel.

5. A fastener as defined in claim 1 wherein said arm means is integral with said stem and extends outwardly and downwardly to an outer end that is adapted for engagement with the upper surface of said outer panel.

6. A fastener as defined in claim 5 wherein said post has a shoulder at the bottom end thereof.

* * * * *